(12) United States Patent
Coolbaugh et al.

(10) Patent No.: US 6,670,228 B2
(45) Date of Patent: Dec. 30, 2003

(54) METHOD OF FABRICATING A POLYSILICON CAPACITOR UTILIZING FET AND BIPOLAR BASE POLYSILICON LAYERS

(75) Inventors: Douglas Duane Coolbaugh, Essex Junction, VT (US); Gregory Gower Freeman, Hopewell Junction, NY (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/339,151

(22) Filed: Jan. 9, 2003

(65) Prior Publication Data

US 2003/0141534 A1 Jul. 31, 2003

Related U.S. Application Data

(62) Division of application No. 09/516,615, filed on Mar. 1, 2000.

(51) Int. Cl.⁷ .................... H01L 21/8238; H01L 21/331
(52) U.S. Cl. .................. 438/202; 438/396; 438/951
(58) Field of Search .................. 438/240–254, 438/381, 396–398, 957; 257/295–310, 530–535

(56) References Cited

U.S. PATENT DOCUMENTS

| | | |
|---|---|---|
| 4,805,071 A | 2/1989 | Hutter et al. |
| 5,047,826 A | 9/1991 | Keller et al. |
| 5,195,017 A | 3/1993 | McDonald |
| 5,268,315 A | 12/1993 | Prasad et al. |
| 5,286,991 A | 2/1994 | Hui et al. |
| 5,317,180 A | 5/1994 | Hutter et al. |
| 5,391,905 A | 2/1995 | Yamazaki |
| 5,407,841 A | 4/1995 | Liao et al. |
| 5,622,887 A * | 4/1997 | Miwa et al. ................. 438/202 |
| 5,641,692 A | 6/1997 | Miwa et al. |
| 5,747,369 A | 5/1998 | Kantimahanti et al. |
| 5,973,954 A | 10/1999 | Wu et al. |
| 6,150,701 A | 11/2000 | Lee |
| 6,236,101 B1 * | 5/2001 | Erdeljac et al. ............. 257/531 |
| 6,284,617 B1 * | 9/2001 | Erdeljac et al. ............. 438/381 |

* cited by examiner

Primary Examiner—Cuong Quang Nguyen
(74) Attorney, Agent, or Firm—Scully, Scott, Murphy & Presser; William D. Sabo

(57) ABSTRACT

A method of forming a poly-poly capacitor, a MOS transistor, and a bipolar transistor simultaneously on a substrate comprising the steps of depositing and patterning a first layer of polysilicon on the substrate to form a first plate electrode of said capacitor and on an electrode of the MOS transistor, and depositing and patterning a second layer of polysilicon on the substrate to form a second plate electrode of said capacitor and an electrode of the bipolar transistor.

23 Claims, 3 Drawing Sheets

METHOD OF FABRICATING A POLYSILICON CAPACITOR UTILIZING FET AND BIPOLAR BASE POLYSILICON LAYERS

RELATED APPLICATIONS

This application is a divisional of U.S. application Ser. No. 09/516,615, filed Mar. 1, 2000.

FIELD OF THE INVENTION

The present invention is directed to a method of fabricating integrated circuits (ICs) and, in particular to a method of fabricating a polysilicon to polysilicon, i.e., poly-poly, capacitor on a BiCMOS device utilizing a field effect transistor (FET) gate layer and a bipolar SiGe extrinsic base polysilicon layer to form the base plates of the capacitor. More specifically, the present invention is directed to a method for fabricating a poly-poly capacitor utilizing process steps and structures which are used to form the gate of the metal oxide semiconductor (MOS) transistor and the base structure of the bipolar transistor in a BiCMOS (i.e., bipolar device and complementary metal oxide semiconductor (CMOS) device) process.

BACKGROUND OF THE INVENTION

In the field of semiconductor device manufacturing, CMOS (complementary metal oxide semiconductor) and BiCMOS (bipolar device and complementary metal oxide semiconductor) technologies have been widely used for integrating highly complex analog-digital subsystems onto a single chip. In such subsystems, high precision capacitors are typically required.

Several types of capacitors are available including diffusion-poly capacitors, poly-poly capacitors and metal-metal capacitors. In order to meet the demand for high precision capacitors in today's generation of integrated devices, poly-poly capacitors have been increasingly used.

Despite its high precision, a poly-poly capacitor is a compromise between high cost and ideal capacitor characteristics since it is relatively easy to construct, and has electrical characteristics better than diffusion-poly capacitors, but inferior electrical characteristics to metal-metal capacitors. However, metal-metal capacitors are much more difficult to fabricate than are poly-poly capacitors. Thus, poly-poly capacitors are the ever increasing choice used in the semiconductor industry for manufacturing integrated circuits in BiCMOS processes.

U.S. Pat. No. 5,195,017 describes in its "background" section several double level polysilicon processes have been employed in fabricating poly-poly capacitors, i.e. the so-called "Lin EPIC double level process" and the "4/3 Linear process".

The Lin EPIC double level process uses a two-mask approach to define a capacitor bottom plate. The first polysilicon layer is masked and etched separate from the second polysilicon layer. Due to separate masking and etching steps, this prior art process is expensive, complicated and time consuming. Additionally, the topography that is associated with this prior art process requires an additional step of planarization prior to depositing metal on the appropriate contact points.

In the other double level process, namely the 4/3 Linear process, a single mask is used to define the bottom plate. The first level of polysilicon serves as the bottom plate and the CMOS gate. After the interlevel dielectric is formed, the second polysilicon layer is deposited to form the capacitor top plate. In order to eliminate filaments from the bottom plate edges and the CMOS gate edges, a large overetch is required. If there is a negative slope on the bottom plate edge, filaments will be trapped under the bottom plate. Moreover, since this is a double level process, the added topography also requires additional planarization prior to metallization.

In view of the drawbacks with prior art methods of fabricating poly-poly capacitors, there is a continued need for developing a new and improved method which significantly reduces the complications and expenses associated with the prior art methods. It would be especially beneficial if a method of fabricating a poly-poly capacitor could be developed which utilizes processing steps and structures which are also used to form the gate of the MOS transistor and base structure of the bipolar transistor in a BiCMOS process since such a method would significantly reduce the number of processing steps and costs associated with manufacturing integrated circuits.

SUMMARY OF THE INVENTION

One object of the present invention is to provide a method of fabricating a poly-poly capacitor for use in CMOS or BiCMOS integrated circuits that is not complicated or expensive to manufacture.

Another object of the present invention is to provide a method of fabricating a poly-poly capacitor utilizing existing polysilicon and masking steps, thereby achieving the integration of the poly-poly capacitor into the BiCMOS device at a low cost.

A yet further object of the present invention is to provide a method of fabricating a poly-poly capacitor utilizing steps and structures that are typically used to form the gate of the MOS transistor and the base structure of the bipolar transistor in a BiCMOS process.

The foregoing and other objects are achieved by constructing a poly-poly capacitor comprising two plate electrodes, wherein at least one of the plate electrodes is composed of SiGe polysilicon, said plate electrodes being separated by an insulating layer.

DETAILED DESCRIPTION OF THE INVENTION

Figure 1A:
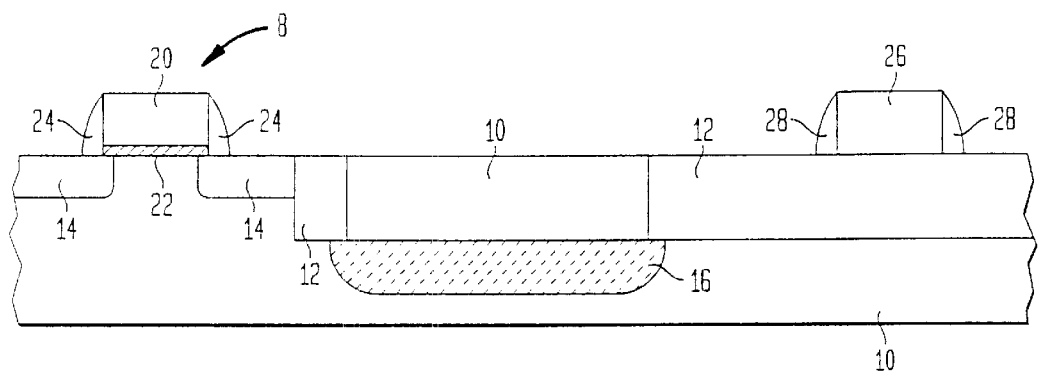
FIGS. 1A–1G are cross-sectional views illustrating the basic processing steps employed in the present invention for fabricating a poly-poly capacitor in a BiCMOS device. The cross-sections are through cut B–B' in FIG. 2.

The present invention which provides a method of fabricating a poly-poly capacitor using field effect transistor gate and bipolar SiGe extrinsic polysilicon layers will now be described in more detail by referring to the drawings that accompanying the present application. It should be noted that in the accompanying drawings like and corresponding elements are referred to be like reference numerals.

Reference is first made to FIGS. 1A–1G which are cross-sectional views showing the various processing steps that are employed in the present invention in fabricating a poly-poly capacitor in a BiCMOS device which includes a bipolar device region and a MOS device region. The MOS device region may comprise a NMOS or a PMOS device. Although the figures or the present invention contain only one poly-poly capacitor, one MOS device and one bipolar device, a plurality of said devices may be present in the final structure after completing the fabrication steps of the present invention.

FIG. 1A illustrates an initial semiconductor structure that can be employed in step (a) of the present invention. Specifically, the initial structure shown in FIG. 1A comprises a substrate 10 having shallow trench isolation regions 12 and source/drain regions 14 formed in the surface of the substrate. Although shallow trench isolation regions are depicted and described herein, the present invention also contemplates deep trench as well as other isolation means. The substrate further includes a subcollector region, i.e., a N+region, 16 which is shown between the two shallow trench isolation (STI) regions—the region between the two STI regions is the area of the structure in which the bipolar device will be formed. The initial structure also includes a FET device 18 that comprises polysilicon gate 20, gate oxide 22 and spacers 24, e.g., nitride spacers, which are formed above the source/drain regions. Also shown in FIG. 1A, is bottom plate 26 which is one of the components present in the poly-poly capacitor of the present invention. The bottom plate of the poly-poly capacitor also includes side wall spacers 28. The bottom plate of the capacitor is composed of the same material as the gate of FET device, i.e., polysilicon. In one embodiment of the present invention, the bottom plate electrode is composed of SiGe polysilicon. In that embodiment, gate 20 would also be composed of SiGe polysilicon.

The structure shown in FIG. 1A is fabricated using conventional BiCMOS processing steps that are well known to those skilled in the art. Moreover, conventional materials are used in fabricating the same. For example, substrate 10 of the semiconductor structure is composed of any semiconducting material including, but not limited to: Si, Ge, SiGe, GaAs, InAs, InP and all other III/V semiconducting compounds. Layered substrates comprising the same or different semiconducting material, e.g., Si/SiGe, are also contemplated in the present invention. Of these semiconducting materials, it is preferred that the substrate be composed of Si. The substrate may be a p-type substrate or a n-type substrate depending on the type of MOS device to be present in the final BiCMOS structure.

The structure shown in FIG. 1A is fabricated utilizing conventional BiCMOS processing up through formation of the gate. That is, a conventional base-after gate processing technique or any other technique capable of forming the structure shown in FIG. 1A can be employed in the present invention. Thus, the present invention is not limited to the base-after gate process described hereinbelow. Instead, the description that follows in regard to forming the structure shown in FIG. 1A is provided for illustrative proposes only. In such a base-after gate process, the polysilicon gate is formed before the base epitixial silicon is grown.

Specifically, the structure shown in FIG. 1A can be fabricated as follows: An oxide film, e.g., $SiO_2$, (not shown in the drawings) is formed on the surface of substrate 10 using a conventional deposition process such as chemical vapor deposition (CVD), plasma-enhanced CVD or sputtering, or alternatively the oxide layer is grown thermally. Subcollector region 16 is then formed in the substrate by utilizing a conventional ion implantation step. After the implant step, a thick oxide, on the order of about 240 nm, is grown on the surface of the substrate to eliminate implantation damage. Next, the thick oxide is etched off and an epitaxial Si layer (not shown) is grown on the surface of the substrate.

A patterned masking layer is then employed to etch shallow trench isolation (STI) regions in the substrate. The STI regions are formed by etching a trench in the substrate utilizing a conventional dry etching process such as reactive-ion etching (RIE) or plasma etching. The trenches may optionally be lined with a conventional liner material, e.g., an oxide, and then CVD or another like deposition process is used to fill the trench with polysilicon or another like STI dielectric material. The STI dielectric may optionally be densified after deposition. A conventional planarization process such as chemical-mechanical polishing (CMP) may optionally be used to provide a planar structure.

Next, a protective material such as $Si_3N_4$ (not shown in the drawings) is formed over the subcollector region of the structure (i.e., bipolar region) utilizing a conventional deposition process such as CVD, with a low pressure CVD process being preferred. This layer is formed over a thin pad oxide layer (also not shown in the drawings) which is employed in the present invention as a screen oxide. After protecting the bipolar region with a protective layer, the FET device is completely fabricated and the base plate of the poly-poly capacitor is simultaneously formed. Following fabrication of the FET device and the base plate of the poly-poly capacitor, the protective layer is removed utilizing conventional stripping processes well known to those skilled in the art.

The FET device is formed by utilizing conventional processing steps that are capable of fabricating MOS transistor devices. Included in the conventional transistor processing steps are: N-well for pFET photolithography, N-well implant, pFET thin oxide tailor implant, P-well for nFET photolithography, P-well implant, n-FET thin oxide tailor implant, dual gate oxide photolithography, dual gate oxide regrowth, FET gate photolithography, FET gate etch, thermal oxide spacer formation, nFET extension photolithography, nFET extension implant (lightly doped drains (LDD)), first spacer formation, pFET extension photolithography, pFET extension (LDD), second spacer deposition, second spacer etch, nFET S/D implant photolithography, nFET S/D anneals.

These transistor processing steps form FET device 18 in the structure shown in FIG. 1A. Specifically, the FET device includes well implants (not shown), S/D (source/drain) regions 14, S/D extensions (included in regions 14), a gate region comprising polysilicon gate 20, gate oxide 22 and spacers 24. The spacers depicted in the drawings include various layers that are formed on the sidewalls of the gate region as well as a horizontal layer that is formed on the substrate. In one embodiment of the present invention, gate 20 and bottom plate 26 are composed of SiGe polysilicon.

As stated above, during the fabrication of the FET device, bottom polysilicon base plate 26 of the poly-poly capacitor is simultaneously formed. Specifically, the bottom base plate is formed at the same time as polysilicon gate 20 by utilizing a conventional deposition process and thereafter both polysilicon regions, i.e., polysilicon gate 20 and base plate 26, are patterned utilizing conventional lithography and RIE. Spacers 28 are also formed at the same time as spacers 24 and are composed of the same material.

Figure 1B:
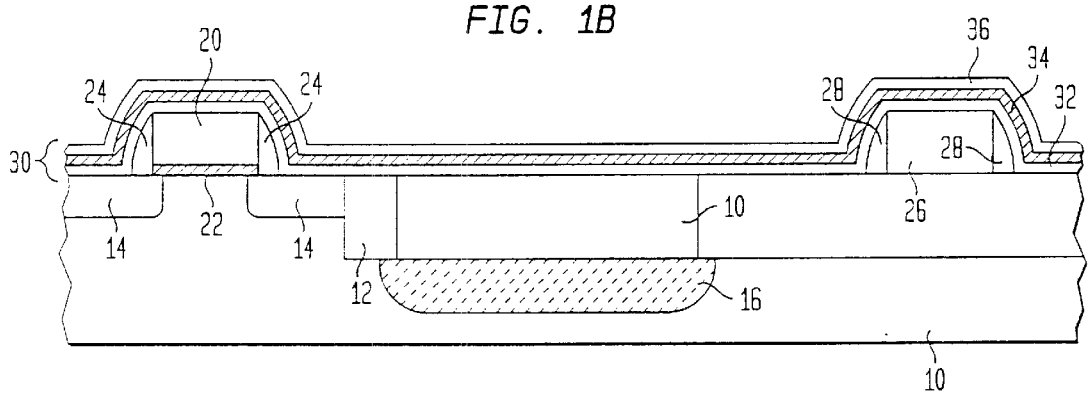
Figure 1C:
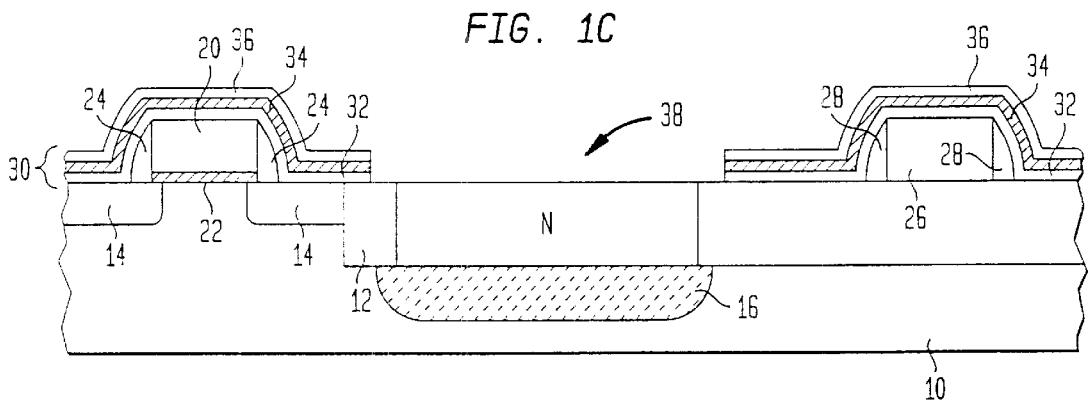

Next, as is shown in FIG. 1B, a film stack 30 is formed over the surface of substrate 10 including FET device 18 and bottom base plate 26. The film stack employed in the present invention comprises any number of material layers provided that the film stack includes a polysilicon layer 34. In the drawings, the film stack also includes a bottom insulator layer 32 and a top insulator layer 36. Insulator layers 32 and 36 may be composed of the same or different insulator material selected from the group consisting of $SiO_2$, Si oxynitride and other like insulative materials. In one embodiment of the present invention, both insulator layers of film stack 30 are composed of $SiO_2$. It is noted that the top insulator layer is optional in the present invention.

In the specific embodiment illustrated in FIG. 1B, film stack 30 is formed utilizing conventional deposition processes well known to those skilled in the art. For example, bottom insulator layer 32 of film stack 30 is formed by a conventional deposition process including, but not limited to: CVD, plasma-enhanced CVD, low pressure CVD, sputtering and other like deposition processes. The thickness of the bottom insulator layer may vary, but typically the thickness of the bottom insulator layer is from about 50 to about 1000 Å, with a thickness of from about 100 to about 200 Å being highly preferred.

Polysilicon layer 34 is then formed on top of bottom insulator layer utilizing conventional deposition processes such as CVD and plasma-enhanced CVD. The thickness of the polysilicon layer is not critical to the present invention, but typically the thickness of the polysilicon layer is from about 100 to about 1000 Å, with a thickness of from about 400 to about 500 Å being highly preferred.

When the top insulator layer is employed, the top insulator layer is formed utilizing the same deposition process as mentioned in connection with the bottom insulator layer. The thickness of the top insulator layer may vary, but typically the thickness of the insulator layer is from about 100 to about 1000 Å, with a thickness of from about 300 to about 500 Å being highly preferred. In embodiments wherein a top insulator layer is not used, a mask can be employed in forming the bipolar opening.

After forming film stack 30 on the surface of the structure, a bipolar opening 38 (See, FIG. 1C) is formed in the structure utilizing conventional lithography and RIE. At this time, the collector is implanted with a N-type dopant utilizing processing steps well known to those skilled in the art. Specifically, the bipolar opening is formed by providing a patterned photoresist (not shown) on the surface of top insulator layer 36 (or on polysilicon layer 34) and then etching through film stack 30, i.e., layers 36, 34 and 32, utilizing a conventional etch process such as RIE or ion beam etching that is highly selective in removing those layers stopping on a protective nitride layer used previously in forming the FET device. The nitride layer is etch away using a wet etch process wherein a chemical etchant such as hot phosphoric acid is employed. It is noted that the bipolar opening is formed over subcollector region 16 and that the opening forms the region in which the bipolar device will be subsequently formed.

Next, if top insulator layer 36 is present, it is removed from the entire structure utilizing a conventional wet chemical etch process that is highly selective in removing the top insulator as compared to the underlying polysilicon layer. In this step of the present invention, the polysilicon layer of the film stack is exposed. Any chemical etchant such as buffered HF can be used in this step of the present invention. It is noted that this step also removes the base pad oxide layer mentioned above from the emitter region of the structure. If no top insulator layer is employed, this removal step can be avoided.

Figure 1D:
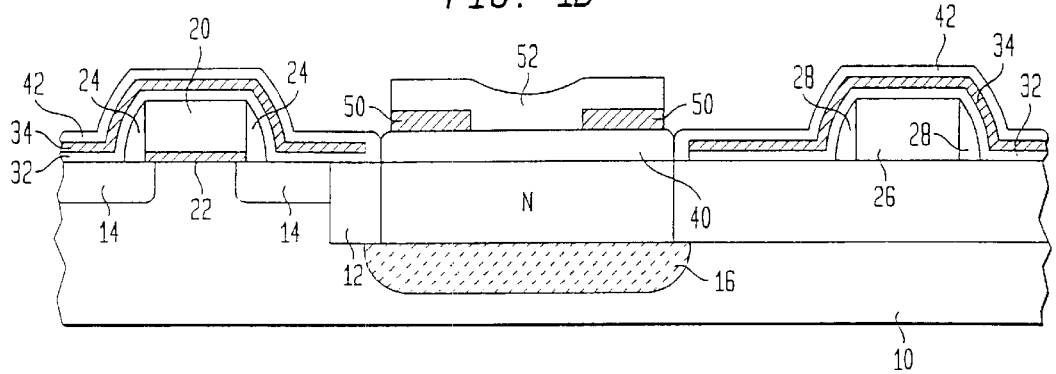

After removal of the optional top insulator layer and the base pad oxide layer from the structure, a SiGe epi layer 40 is formed in the bipolar opening and, at the same time, a SiGe polysilicon film 42 is formed over portions of the exposed polysilicon layer, See FIG. 1D. SiGe layers 40 and 42 are formed in the present invention by utilizing a deposition process, wherein the deposition temperature is low, i.e., less than 900° C. More specifically, the deposition temperature used in this step of the present invention is from about 400° to about 500° C. The thickness of these two SiGe layers may vary, and not need be the same; however, it is preferred in the present invention that SiGe epi layer 40 and SiGe polysilicon film layer 42 have the same thickness. Typically, the thickness for each of these two low temperatures SiGe layers is from about 1000 to about 5000 Å, with a preferred thickness for each layer being of from about 2000 to about 2500 Å. It is noted that the SiGe layer contains the P-doped intrinsic base.

The bipolar region has an extrinsic base that is self-aligned to bipolar opening 38. The poly-poly capacitor, on the other hand, may be produced with a non self-aligned process. Several sacrificial layers (not shown in the drawings) and passivating layers, e.g., oxide/nitride, are then formed over the structure and etched by conventional means, e.g., RIE, to form sacrificial spacers (also not shown in the drawings) and patterned passivating layers 50. SiGe epi layer 40 is then doped with a P+ dopant (or N+ dopant) utilizing a conventional ion implantation process. A preferred P+ dopant employed in this step of the present invention is boron and the preferred dose is $4\times10^{15}$ atoms/$cm^2$. It is noted that during this implantation step, SiGe polysilicon layer 42 is also doped with a P+ dopant (N+ dopant). The sacrificial spacers used above are then removed so as to open the emitter window, while patterned passivating layers 50 remain in the structure forming an emitter window.

The emitter is formed by depositing polysilicon over the emitter window utilizing a conventional deposition process such as CVD, plasma-enhanced CVD, sputtering and other like deposition processes. The thickness of the emitter polysilicon is from about 500 to about 5000 Å, with a thickness of from about 1000 to about 1600 Å being more preferred. The emitter polysilicon is then heavily doped with a N+ type dopant such as As (or alternatively a P+ type dopant) and thereafter the emitter polysilicon is patterned by employing conventional lithography and etching. The structure that results from the above processing steps is illustrated in FIG. 1D. The emitter depth is set by utilizing a high temperature (900°–1100° C.) rapid thermal anneal process.

Figure 1E:
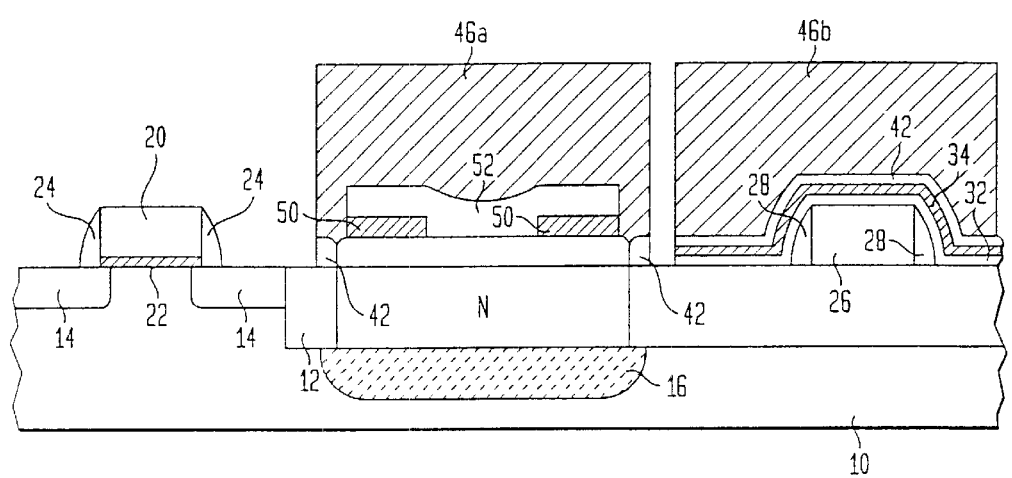

The mask used to pattern emitter polysilicon 52 is then removed from the structure utilizing conventional stripping processes well known to those skilled in the art and thereafter etch masks 46a and 46b are formed over the bipolar device region of the structure as well as over the area of the structure which includes the bottom base plate, i.e., poly-poly capacitor region. The structure including the two etch masks is shown in FIG. 1E. The two etch masks are formed utilizing conventional lithography and etching. After formation of the etch masks, exposed portions of doped polysilicon film 42 and the remaining layers of film stack 30, i.e., layers 32 and 34, are removed utilizing a conventional wet chemical etch process that is highly selective in removing those layers from the structure. The structure after removing the exposed portions of the doped polysilicon film and the remaining layers or the film stack is shown in FIG. 1E.

Figure 1F:
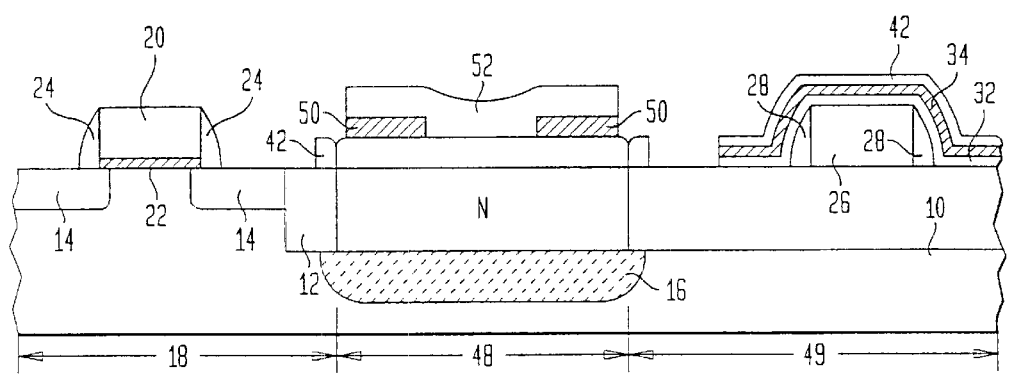

FIG. 1F show the structure after the two etch masks have been removed utilizing conventional stripping processes that are well known to those skilled in the art. Specifically, the structure shown in FIG. 1E, includes FET device region 18, a completed bipolar device region 48 and poly-poly capacitor region 49.

Figure 1G:
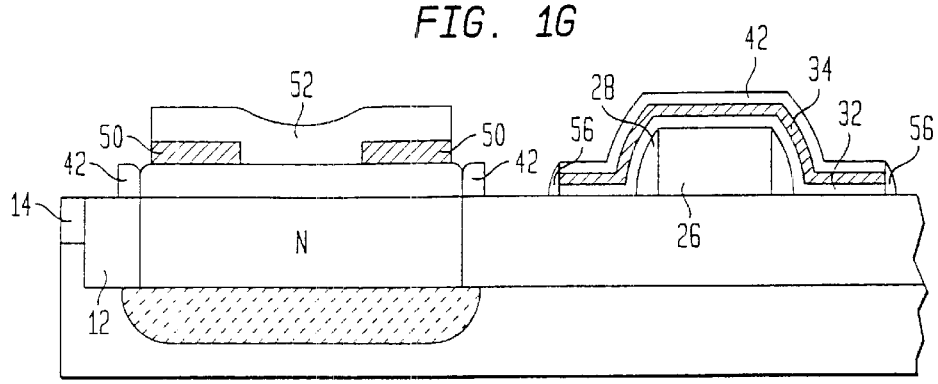

Reference is now made to FIG. 1G which illustrates a blown-up portion of the structure shown in FIG. 1F minus the FET device 18. Specifically, FIG. 1G shows only the bipolar device region and the poly-poly capacitor region of the structure after completion of each region. As is shown in FIG. 1G, spacers 56 may optionally be formed on exposed edges of the poly-poly capacitor by first depositing an insulator layer such as $Si_3N_4$ and then etching the same. It should be noted that the processing steps used in completing the bipolar device and the poly-poly capacitor do not affect the FET device of the structure.

Silicide regions are then formed in selected areas of the bipolar/FET devices using conventional salicide processes well known to those skilled in the art.

Next, a passivation layer and a dielectric layer may be formed over the FET and bipolar devices and metal vias or contact studs are formed through those layers to metal polysilicon contacts. Conventional deposition processes are used in forming the passivation and dielectric layers and the contact openings are formed by conventional lithography and etching. The contact openings are filled utilizing a conventional deposition process and, if needed, a conventional planarization process is employed.

Any conventional passivation material such as $Si_3N_4$ or a polyimide may be employed in forming the passivation layer; and any conventional dielectric material such as $SiO_2$ or $Si_3N_4$ may be employed in forming the dielectric layer. Insofar as the contact studs are concerned, any conventional conductive metal such as Ti, W, Cu, Cr and Pt may be employed in the present invention. Next, the devices are contacted with metal contacts and back end of the line processing is used to complete fabrication of the device.

Figure 2:
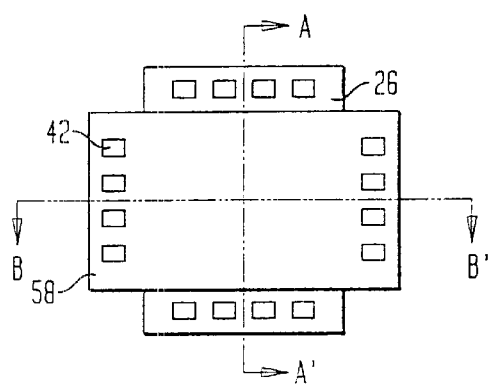
FIG. 2 is a top view of the poly-poly capacitor produced in FIGS. 1A–1G, and indicates the cut, A–A', shown in FIG. 3; the illustrated capacitor structure is shown after metal contacts are formed in the structure of FIG. 1G.
Figure 3:
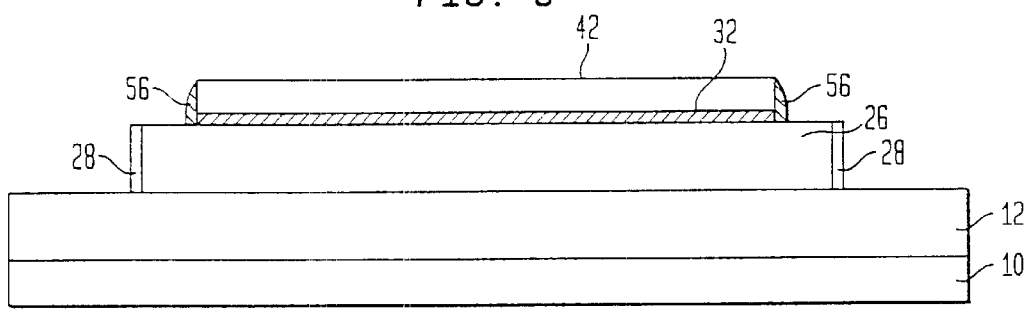
FIG. 3 is a cross-sectional view through A–A' showing the need for insulating spacers on the top plate to electrically isolate the top plate from the bottom plate.

FIG. 2 is a top view of the poly-poly capacitor shown in FIG. 1G after metal contacts 58 have been formed thereon. In this figure, the poly-poly capacitor comprises bottom polysilicon layer 26 and doped SiGe polysilicon layer 42 as the top plate of the capacitor. FIG. 3 is a cross-sectional view through A–A' of FIG. 2. As is shown in FIG. 3, the poly-poly capacitor comprises substrate 10, STI region 12, bottom plate 26, bottom insulator layer 32 and top plate 42. Spacers 28 and 56 are shown on exposed edges of the poly-poly capacitor; the spacers serve to electrically isolate the top plate from the bottom plate of the capacitor.

It is emphasized that the poly-poly capacitor of the present invention includes at least one plate electrode that contains SiGe polysilicon. In some embodiments of the present invention both of the electrodes are composed of SiGe polysilicon.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a poly-poly capacitor, a MOS transistor, and a bipolar transistor simultaneously on a substrate comprising the steps of:

depositing and patterning a first layer of polysilicon on the substrate to form a first plate electrode of said capacitor and on an electrode of the MOS transistor; and depositing and patterning a second layer of polysilicon on the substrate to form a second plate electrode of said capacitor and an electrode of the bipolar transistor, said second layer of polsilicon comprising SiGe polysilicon.

2. The method of claim 1 wherein electrode of the MOS transistor comprises a polysilicon gate formed on a gate oxide, said gate oxide being formed on a surface of the substrate, the substrate having source and drain regions beneath said polysilicon gate.

3. The method of claim 2 wherein the substrate is a semiconducting material selected from the group consisting of Si, Ge, SiGe, GaAs, InAs and layered semiconductor substrates.

4. The method of claim 2 wherein the substrate further comprises shallow trench isolation regions and a subcollector region, said subcollector region being formed between said shallow trench isolation regions.

5. A method of forming a poly-poly capacitor comprising the steps of:

(a) forming a film stack on a surface of a semiconductor structure, said structure comprising at least a gate region of a metal oxide semiconductor device and a bottom polysilicon plate of a poly-poly capacitor formed on a surface thereof, said film stack including at least a polysilicon layer;

(b) forming a bipolar opening in said film stack exposing at least a portion of said surface of said semiconductor structure, wherein said bipolar opening is formed in a region in which a bipolar device will be subsequently fabricated;

(c) simultaneously forming a SiGe epi layer in said bipolar opening, while forming a SiGe polysilicon film on exposed portions of said polysilicon layer of said film stack;

(d) selectively doping portions of said SiGe polysilicon film as well as said SiGe epi layer with a dopant atom of a first conductivity type;

(e) forming a patterned passivating layer on a portion of said doped SiGe epi layer;

(f) forming a patterned doped emitter polysilicon layer on said patterned passivating layer as well as on said doped SiGe epi layer formed in said bipolar opening thereby completing fabrication of said bipolar device, said doped emitter polysilicon layer having a different conductivity than said doped SiGe epi layer; and (g) removing selective portions of said doped SiGe polysilicon film and remaining layers of said film stack so as to expose said gate of said metal oxide semiconductor while protecting said bipolar device region and said doped SiGe polysilicon layer overlying said bottom polysilicon plate of said poly-poly capacitor.

6. The method of claim 5 wherein said film stack further comprises a bottom insulator layer and an optional top insulator layer.

7. The method of claim 6 wherein said top and bottom insulator layers of said film stack are the same or different insulative materials selected from the group consisting of $SiO_2$ and Si oxynitrides.

8. The method of claim 7 wherein said top and bottom insulator layers are both composed of $SiO_2$.

9. The method of claim 6 wherein said top insulator layer has a thickness of from about 100 to about 1000 Å.

10. The method of claim 6 wherein said bottom insulator layer has a thickness of from about 50 to about 1000 Å.

11. The method of claim 5 wherein said polysilicon layer has a thickness of from about 100 to about 1000 Å.

12. The method of claim 5 wherein said bipolar opening is formed by employing lithography and etching.

13. The method of claim 12 wherein said etching is carried out by reactive-ion etching or ion beam etching.

14. The method of claim 6 wherein said optional top insulator layer is removed utilizing an etch process that is highly selective in removing said top insulator layer as compared to said underlying polysilicon layer.

15. The method of claim 5 wherein said SiGe epi layer and said SiGe polysilicon film are formed simultaneously utilizing a deposition process that is carried out at temperatures of from about 900° C. or below.

16. The method of claim 15 wherein said temperature of said deposition process is from about 400° to about 500° C.

17. The method of claim 5 wherein said SiGe epi layer and said SiGe polysilicon film have the same or different thickness.

18. The method of claim 17 wherein said SiGe epi layer and said SiGe polysilicon film have the same thickness, said thickness of each layer being of from about 1000 to about 5000 Å.

19. The method of claim 5 wherein said dopant used in doping said SiGe epi layer is boron having a concentration of about $4 \times 10^{15}$ atoms/cm$^2$.

20. The method of claim 5 wherein said dopant used in doping said emitter polysilicon is As.

21. The method of claim 5 wherein said patterned emitter doped polysilicon layer is formed by depositing a layer of polysilicon, doping said layer with a dopant and thereafter subjecting said emitter doped polysilicon layer to lithography and etching.

22. The method of claim 1 wherein optional spacers are formed on said poly-poly capacitor.

23. The method of claim 22 wherein said optional spacers are formed by deposition, lithography and etching.

* * * * *